US006859117B2

United States Patent
Martin et al.

(10) Patent No.: US 6,859,117 B2
(45) Date of Patent: Feb. 22, 2005

(54) RESONATOR FILTER CASCADE

(75) Inventors: Guenter Martin, Dresden (DE); Bert Wall, Potsdam (DE)

(73) Assignee: Tele Filter Zweigniederlassung der Dover Germany, GmbH, Teltow (DE)

( * ) Notice: Subject to any disclaimer, the term of this patent is extended or adjusted under 35 U.S.C. 154(b) by 19 days.

(21) Appl. No.: 10/303,419

(22) Filed: Nov. 25, 2002

(65) Prior Publication Data

US 2003/0160666 A1 Aug. 28, 2003

(30) Foreign Application Priority Data

Dec. 14, 2001 (DE) ........................................ 101 63 517

(51) Int. Cl.[7] ................................................. H03H 9/64
(52) U.S. Cl. ..................... 333/193; 333/195; 310/313 D
(58) Field of Search ................................ 333/193–196; 310/313 B, 313 D

(56) References Cited

U.S. PATENT DOCUMENTS

| 5,581,141 A | * | 12/1996 | Yamada et al. | 310/313 D |
| 5,936,487 A | * | 8/1999 | Solal et al. | 333/193 |
| 6,043,726 A | * | 3/2000 | Solal et al. | 333/195 |
| 6,384,698 B1 | * | 5/2002 | Hayashi et al. | 333/195 |

FOREIGN PATENT DOCUMENTS

| DE | 42 27 362 A1 | * | 2/1994 |
| DE | 44 21 665 A1 | * | 1/1996 |
| DE | 44 39 489 C1 | * | 1/1996 |

OTHER PUBLICATIONS

B. Wall et al.; "Balanced Driven Transversely Coupled Waveguide Resonator Filters"; Processings, IEEE 1996 Ultrasonics Symposium; vol. 1, pp. 47–51, Nov. 3–6, 1996.*

* cited by examiner

*Primary Examiner*—Barbara Summons
(74) *Attorney, Agent, or Firm*—Jordan and Hamburg LLP

(57) ABSTRACT

A resonator filter cascade has resonator structures disposed adjacent to one another and form a waveguide for acoustic surface waves, and coupling transducers. The present invention changes resonator filter cascades so that the insertion attenuation is reduced by decreasing the attenuation of cascading, without using a coupling coil. A resonator filter cascade has resonator structures having coupling transducers which transversely couple resonator filters and the coupling transducers, belonging the same transversely coupled resonator filter, are not connected with one another. Coupling transducers of different transversely coupled resonator filters are each connected with one another over a pair of electrically conducting connections.

11 Claims, 1 Drawing Sheet

RESONATOR FILTER CASCADE

BACKGROUND OF THE INVENTION

The present invention relates to the field of electrotechnology and electronics, in particular, components based on acoustic surface waves, such as bandpass filters with a relative bandwidth on the order of 0.1 percent, as well as oscillators.

Resonator filter cascades are known, for which at least two transversely coupled resonator filters, which are composed of several resonator structures, which are disposed next to one another, and form a waveguide for acoustic surface waves, are connected with one another so that each of the two transversely coupled resonator filters contains transducers, which include bus bars and electrode fingers and are referred to as coupling transducers and are connected over electrically conducting connections with a coupling transducer of a different transversely coupled resonator filter. Transducers, which are not coupling transducers, an input transducer in the case of one of the transversely coupled resonator filters—optionally as a parallel connection—and, in an analogous manner, an output transducer in the case of the other transversely resonator filter.

A special embodiment (G. Martin, B. Wall, R. Kunze, M. Weihnacht, Proceedings 1993 IEEE Ultrasonics Symposium, pages 35–39) contains four transducers, two of which are connected in parallel. FIG. 1 of this paper shows, a not cascaded, transversely coupled resonator filter However, a use of such transversely coupled resonator filters in a filter cascade is explicitly mentioned. If transducers of different individual filters, connected in parallel in this filter cascade, are connected electrically conducting with one another, then this means that in each case two transducers are operated as a parallel connection as coupling transducers In the case of a further, special embodiment (DE 42 27 362), a resonator filter cascade consists of two transversely coupled resonator filters. Coupling transducers of various transversely coupled resonator filters are connected with one another over a pair of electrically conducting connections, called cascade connections. A complex coupling resistance is connected between these connections. In the event that this complex coupling resistance is a coil, called a coupling coil, the cascading attenuation, resulting from the mismatching of the cascade connection, is reduced and, consequently, the insertion attenuation of the resonator filter cascade is decreased.

This solution has the disadvantage that the use of coupling coils results in too high a cost when the resonator filter cascades are used in electronic circuits.

SUMMARY OF THE INVENTION

It is therefore an object of the present invention to change resonator filter cascades of the known type so that the insertion attenuation of the filters is reduced by decreasing the attenuation as a result of cascading, without using a coupling coil.

This objective is accomplished by a resonator filter cascade, for which the number of resonator structures, the transducers of which are coupling transducers, is more than one in all transversely coupled resonator filters and the coupling transducers, belonging to one and the same transversely coupled resonator filters, are not connected with one another. In addition and pursuant to the present invention, two coupling transducers of different, transversely coupled resonator filters are each connected with one another over a pair of electrically conducting connections.

Assuming that the coupling transducers are identical, the mismatching during cascading varies inversely with the ratio of the actual conductivity G to the susceptance $2\pi f_R C$ of the coupling transducer at a resonance frequency $f_R$ (C=capacitance of the coupling transducer). In the case of resonator filter cascades with only one coupling transducer per transversely coupled resonator filter, the ratio $G/2\pi f_0 C$ can be increased only at one of the resonances, which originate from the first two waveguide modes and form the passband. However, for the second resonance, the ratio $G/2\pi f_0 C$ is decreased, so that, averaged over the passband, the mismatching resulting from cascading is decreased only relatively little.

In the case of several groups of coupling transducers per transversely coupled resonator filter, of which only those coupling transducers are connected electrically conducting with one another, which belong to different, transversely coupled resonator filters, it is possible to decrease the mismatching during cascading for both resonances, which form the passband.

According to an appropriate embodiment of the present invention, those resonator structures, which form the input or output of the resonator filter cascade and also those resonator structures, which contain only coupling transducers, are constructed identically.

In this connection, it is particularly appropriate if, in each case, identically constructed coupling transducers of different transversely coupled resonator filters are connected with one another over a pair of electrically conducting connections.

Pursuant to the present invention, several coupling transducers may be present in at least some resonator structures. These form a group of coupling transducers, in which the coupling transducers are disposed consecutively in a direction perpendicular to the electrode fingers and have the same aperture. In this connection, it is particularly advantageous if each group of coupling transducers has two coupling transducers.

Advisably, the number of coupling transducers of each transversely coupled resonator filter can be two.

According to an appropriate development, each resonator structure contains one coupling transducer. Moreover, the number of coupling transducers per transversely coupled resonator filter can be two.

The sum of the apertures of the two groups of coupling transducers per transversely coupled resonator filter can be larger than half the sum of the apertures of all transducers of the transversely coupled resonator filter in question, only one aperture value per coupling transducer group being taken into consideration in this sum.

For each transversely coupled resonator filter, one of the groups of coupling transducers may be disposed below and the other group of coupling transducers above the center line of the reflector strip area/transducer finger area extending perpendicularly to the electrode fingers.

In the event that each group of coupling transducers contains two coupling transducers, it is appropriate if the overlapping lengths of the electrode fingers in the groups of coupling transducers are selected so that they form a function, which is asymmetrical in relation to the center line of the resonator structures extending parallel to the direction of the electrode fingers.

The resonator filter cascade can be part of a cascade chain, at least the input or output of this resonator filter cascade being connected with the output of the preceding or the input of the following resonator filter cascade by a pair of electrically conducting connections.

The number of transversely coupled resonator filters per resonator filter cascade may be two.

It is particularly advisable when at least one component of all pairs of electrically conducting connections forms a common connection, when these components are at the same potential.

In the event that the potential of these electrically conducting connections differ from one another, a reactance may be connected between electrically conducting connections, which connect the coupling transducers of different transversely coupled resonator filters with one another.

According to a further appropriate development of the present invention, in the event that the resonator structures in question contain more than one transducer, the transducer may be connected in parallel or in series in those resonator structures, the transducers of which form the input or output of the resonator filter cascade.

The present invention is explained in greater detail below by means of an example and an associated drawing.

BRIEF DESCRIPTION OF THE DRAWING

The FIGURE shows a resonator filter cascade according to one embodiment of the invention.

DESCRIPTION OF THE PREFERRED EMBODIMENTS

Figure 1:
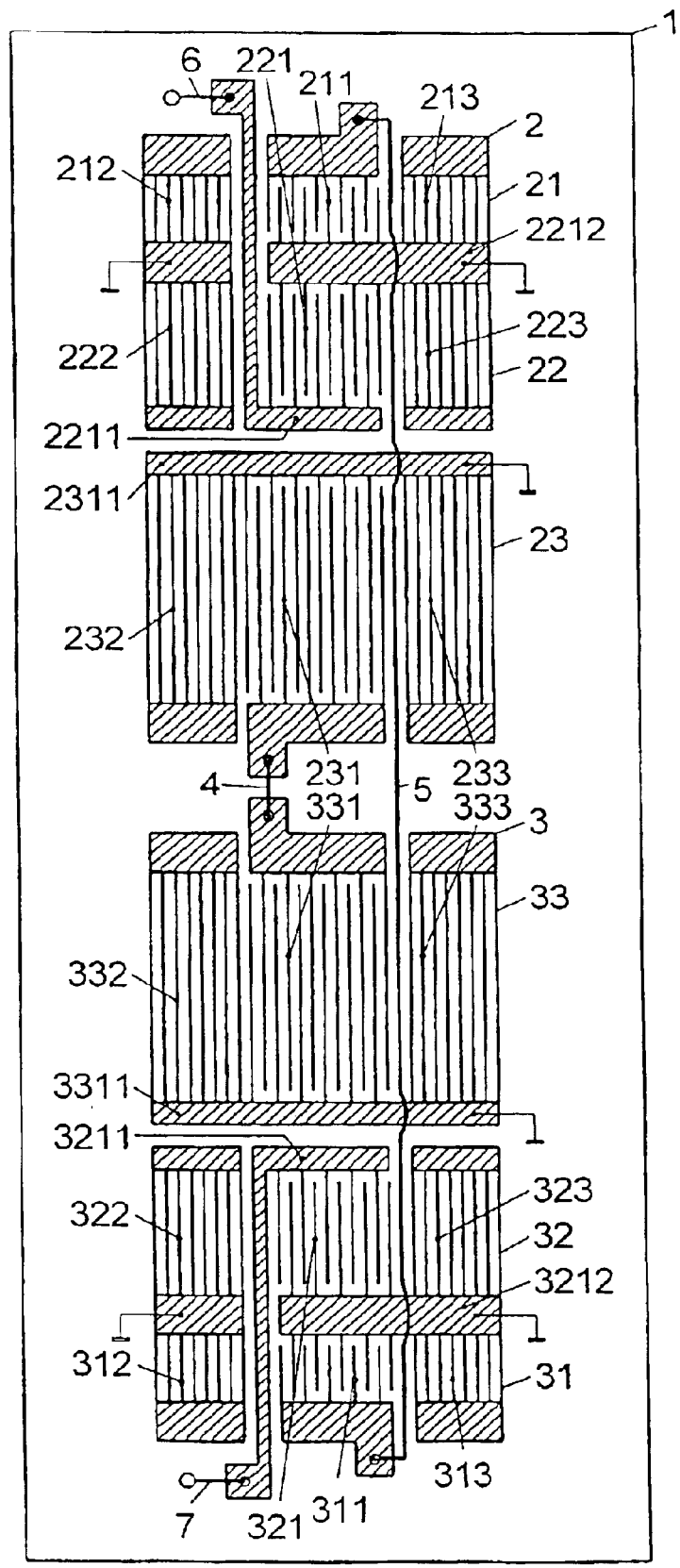

On a piezoelectric substrate 1, two identical, transversely coupled resonator filters 2 and 3 are disposed, which are composed in each case of three resonator structures 21, 22 and 23 or 31, 32 and 33, which are disposed adjacent to one another. In these resonator structures, reflectors 212 and 213, 222 and 223, 232 and 233, 312 and 313, 322 and 323 as well as 332 and 333 in the same sequence enclose plane cavities, in which transducers 211, 221 231, 311, 321 and 331 are disposed. The transducers 211 and 311, 221 and 321 as well as 231 and 331 are constructed identically in pairs.

The transducers 211 and 311 as well as 231 and 331, which belong to different transversely coupled resonator filters, are connected with one another over electrically conducting connections 5 and 4. The second connection between the transducers 211 and 311 or 231 and 331 is produced over connections of bus bars 2212 and 3212 or 2311 and 3311 to the ground potential. Accordingly, the transducers 211, 231, 311 and 331 are operated as coupling transducers.

The transducer 221 is connected with input 6 of the resonator filter cascade and therefore is the input transducer of the resonator filter cascade. In an analogous manner, the transducer 321 is connected with output 7 of the resonator filter cascade and therefore is the output transducer of the resonator filter cascade.

Because they are at the same potential, the adjacent bus bars of the transducers 211 and 221 as well as 311 and 321 are combined into a common bus bar. On the other hand, the adjacent bus bars 2211 and 2311 of the transducers 221 and 231, as well as the adjacent bus bars 3211 and 3311 of the transducers 321 and 331 are separated from one another because they are at different potentials.

What is claimed is:

1. A resonator filter cascade comprising:
    first and second resonator filters each including:
        sequentially adjacent first, second and third resonator structures forming a surface acoustic waveguide;
        said first resonator structure having at least a first coupling transducer with a first connection bus bar which operates as one of an output and input;
        said third resonator structure having at least a second coupling transducer with a second connection bus bar which operates as one of an output and input;
        said first connection bus bar and said second connection bus bar being unconnected with one another; and
        said second resonator having an input/output transducer for receiving or outputting signals;
    said first resonator filter having said input/output transducer as an input transducer, and said first and second connection bus bars of said first and second coupling transducers as outputs;
    said second resonator filter having said input/output transducer as an output transducer, and said first and second connection bus bars of said first and second coupling transducers as inputs; and
    electrical connections respectively connecting:
        said first and second connection bus bars of said first and second coupling transducers of said first resonator filter; to
        said first and second connection bus bars of said first and second coupling transducers of said second resonator filter.

2. The resonator filter cascade of claim 1 wherein said first, second, and third resonator structures of said first resonator filter are respectively mirror images of said first, second, and third resonator structures of said second resonator filter.

3. The resonator filter cascade of claim 2 wherein for each of said first and second resonator filters, a sum of apertures of said first and second coupling transducers is greater than half a sum of said first and second coupling transducers and said input/output transducer.

4. A resonator filter cascade comprising at least two of the resonator filter cascades of claim 3 with the output of the second resonator filter of one of the at least two of the resonator filter cascades connected to the input of the first resonator filter of another one of the at least two of the resonator filter cascades.

5. The resonator filter cascade of claim 4 wherein a number of resonator filters is limited to said first and said second resonator filters.

6. The resonator filter cascade of claim 1 wherein for each of said first and second resonator filters, a sum of apertures of said first and second coupling transducers is greater than half a sum of said first and second coupling transducers and said input/output transducer.

7. A resonator filter cascade comprising at least two of the resonator filter cascades of claim 6 with the output of the second resonator filter of one of the at least two of the resonator filter cascades connected to the input of the first resonator filter of another one of the at least two of the resonator filter cascades.

8. The resonator filter cascade of claim 7 wherein a number of resonator filters is limited to said first and said second resonator filters.

9. A resonator filter cascade comprising at least two of the resonator filter cascades of claim 1 with the output of the second resonator filter of one of the at least two of the resonator filter cascades connected to the input of the first resonator filter of another one of the at least two of the resonator filter cascades.

10. The resonator filter cascade of claim 9 wherein a number of resonator filters is limited to said first and said second resonator filters.

11. The resonator filter cascade of claim 1 wherein a number of resonator filters is limited to said first and said second resonator filters.

* * * * *